United States Patent
Pi et al.

(10) Patent No.: US 11,122,681 B2
(45) Date of Patent: Sep. 14, 2021

(54) PCB BOARD, MANUFACTURING METHOD OF PCB BOARD AND ELECTRICAL DEVICE

(71) Applicant: ZOPOISE TECHNOLOGY (ZHUZHOU) CO., LTD., Zhuzhou (CN)

(72) Inventors: Bruce Pi, Zhuzhou (CN); Wei Kang, Zhuzhou (CN); Jie Dong, Zhuzhou (CN); Weixiong Liu, Zhuzhou (CN); Guicheng Yin, Zhuzhou (CN); Zhibin Zhang, Zhuzhou (CN); Yikai Xu, Zhuzhou (CN)

(73) Assignee: ZOPOISE TECHNOLOGY (ZHUZHOU) CO., LTD., Zhuzhou (CN)

( * ) Notice: Subject to any disclaimer, the term of this patent is extended or adjusted under 35 U.S.C. 154(b) by 0 days.

(21) Appl. No.: 16/562,276

(22) Filed: Sep. 5, 2019

(65) Prior Publication Data

US 2020/0389971 A1    Dec. 10, 2020

(30) Foreign Application Priority Data

Jun. 5, 2019 (CN) .......................... 201910487129.2
Jul. 4, 2019 (CN) .......................... 201910600311.4

(51) Int. Cl.
*H05K 1/02* (2006.01)
*F21V 29/503* (2015.01)
(Continued)

(52) U.S. Cl.
CPC ............. *H05K 1/0271* (2013.01); *F21V 3/00* (2013.01); *F21V 7/05* (2013.01); *F21V 29/503* (2015.01);
(Continued)

(58) Field of Classification Search
CPC ...... H05K 1/0271; H05K 3/28; H05K 1/0204; H05K 1/0266; H05K 1/0274;
(Continued)

(56) References Cited

U.S. PATENT DOCUMENTS 3,953,625 A    4/1976 Quaintance et al.
4,673,609 A    6/1987 Hill
(Continued)

FOREIGN PATENT DOCUMENTS

EP    0170472 A2    2/1986

OTHER PUBLICATIONS

European Search Report issued in corresponding application No. 19196367.7, dated Apr. 28, 2020.

*Primary Examiner* — Peggy A Neils
(74) *Attorney, Agent, or Firm* — Maschoff Brennan

(57) ABSTRACT

The present disclosure provides a PCB board, a manufacturing method of a PCB board, and an electrical device, where the PCB board includes an insulating dielectric layer which is a glass substrate layer including a top surface and a bottom surface disposed oppositely; a conductive wiring layer which is disposed on a top surface of the insulating dielectric layer; and a top ink layer which is coated on the conductive wiring layer. According to the technical solution provided by the embodiment of the disclosure, the PCB board does not generate the phenomenon of deformation warping, and the conductive wiring layer is not easily peeled off from the insulating medium layer, and the use performance of the PCB board is good.

6 Claims, 3 Drawing Sheets

(51) Int. Cl.
  *F21V 29/70* (2015.01)
  *F21V 29/85* (2015.01)
  *F21V 3/00* (2015.01)
  *F21V 7/05* (2006.01)
  *H05K 1/03* (2006.01)
  *H05K 1/09* (2006.01)
  *H05K 3/00* (2006.01)
  *H05K 3/12* (2006.01)
  *H05K 3/28* (2006.01)
  *F21Y 115/10* (2016.01)

(52) U.S. Cl.
  CPC .............. *F21V 29/70* (2015.01); *F21V 29/86* (2015.01); *H05K 1/0204* (2013.01); *H05K 1/0216* (2013.01); *H05K 1/0266* (2013.01); *H05K 1/0274* (2013.01); *H05K 1/0306* (2013.01); *H05K 1/09* (2013.01); *H05K 3/0052* (2013.01); *H05K 3/1216* (2013.01); *H05K 3/1283* (2013.01); *H05K 3/28* (2013.01); *F21Y 2115/10* (2016.08); *H05K 2201/09936* (2013.01); *H05K 2201/10106* (2013.01); *H05K 2201/10113* (2013.01); *H05K 2203/1131* (2013.01)

(58) Field of Classification Search
  CPC .. H05K 3/1283; H05K 3/0052; H05K 1/0306; H05K 3/1216; H05K 1/09; H05K 1/0216; H05K 2203/1131; H05K 2201/10113; H05K 2201/09936; H05K 2201/2201; H05K 2201/10106; F21Y 2115/10; F21V 29/86; F21V 7/05; F21V 23/004; F21V 23/005; F21V 23/009
  See application file for complete search history.

(56) References Cited

U.S. PATENT DOCUMENTS

| | | | |
|---|---|---|---|
| RE37,186 E | 5/2001 | Hill | |
| 9,074,743 B2 * | 7/2015 | Heim | F21S 8/04 |
| 9,345,123 B2 * | 5/2016 | Yang | H05K 1/02 |
| 9,367,094 B2 * | 6/2016 | Bibl | H01L 31/16 |
| 9,478,583 B2 * | 10/2016 | Hu | H01L 27/156 |
| 9,801,287 B2 * | 10/2017 | Mansky | G02F 1/13439 |
| 9,812,621 B2 * | 11/2017 | Ishihara | H01L 24/97 |
| 9,814,139 B2 * | 11/2017 | Watanabe | H05K 1/112 |
| 2009/0141492 A1 * | 6/2009 | Fujino | H01L 33/60 |
| | | | 362/249.02 |
| 2012/0175664 A1 * | 7/2012 | Lin | H05K 1/0203 |
| | | | 257/99 |
| 2013/0114255 A1 * | 5/2013 | Schick | F21V 11/00 |
| | | | 362/236 |
| 2014/0042467 A1 * | 2/2014 | Livesay | H01L 33/642 |
| | | | 257/88 |
| 2015/0176820 A1 | 6/2015 | Abe et al. | |
| 2017/0167713 A1 * | 6/2017 | Hong | F21V 29/503 |
| 2020/0258423 A1 * | 8/2020 | Yeh | H05K 3/305 |

\* cited by examiner

PCB BOARD, MANUFACTURING METHOD OF PCB BOARD AND ELECTRICAL DEVICE

TECHNICAL FIELD

The present disclosure relates to the field of PCB board technology, and in particular to a PCB board, a manufacturing method of a PCB board, and an electrical device.

BACKGROUND

A PCB board (Printed Circuit Board) generally includes an insulating layer and a conductive layer. In the conventional PCB board industry, the insulating layer is made of an organic material, and the organic material applied to the PCB board may include phenolic resin, glass fiber/ethoxyline resin, Polyimide, BT/Epoxy (ethoxyline resin) and so on. In general, an aluminum substrate or a glass fiber board is used as a substrate layer, the resin is used as an insulating layer and a copper foil is then layered on the insulating layer.

An insulating layer made by resin is the main reason for the warpage of the PCB board. The expansion and extending coefficient of the resin is large, and the deformation warp is easily generated. Even the deformation causes the conductive layer to peel off from the insulating layer, thereby affecting the performance of the PCB board.

SUMMARY

In view of the above problems, the present disclosure is proposed to solve the above problem or at least partially solve the above problem.

The embodiment of the first aspect of the present disclosure provides a PCB board, including:

an insulating dielectric layer, where the insulating dielectric layer is a glass substrate layer, and the glass substrate layer includes a top surface and a bottom surface disposed oppositely;

a conductive wiring layer, where the conductive wiring layer is disposed on a top surface of the insulating dielectric layer; and a top ink layer, where the top ink layer is coated on the conductive wiring layer.

Further including:

a bottom ink layer, where the bottom ink layer is coated on the bottom surface of the insulating dielectric layer.

Further, the top ink layer is a white reflective ink layer.

Further, the bottom ink layer is a non-transparent ink layer.

Further, the conductive wiring layer is a silver paste wiring layer printed by silver paste.

Further including:

a character layer, where the character layer is printed on the top ink layer.

According to the PCB board provided by the embodiment of the first aspect of the present disclosure, since the glass substrate layer is used as the substrate and the insulating dielectric layer replacing the structure bonding a the aluminum substrate or the glass fiber board with the insulating resin in the prior art, and the expansion and extending coefficient of the glass is small, the deformation warp is not easily generated, and the conductive wiring layer is not easily peeled off from the insulating medium layer. Thereby, the use performance of the PCB board is improved. Since the glass may also have the function of dissipating heat, no additional heat radiation structure is required. Thereby, the heat dissipation structure may effectively save costs.

The embodiment of another aspect of the present disclosure provides an electrical device, including: the PCB board described above.

Further, the electrical device is a lamp.

Further including: a light source, where the light source is disposed on a top surface of the PCB board, and the light source is electrically coupled to the conductive wiring layer.

Further including: a transparent cover and a lamp body, where the transparent cover is disposed opposite to the top surface of the PCB board, and the lamp body is disposed between the transparent cover and the PCB board for connecting the transparent cover and the PCB board, and a gap is provide between the transparent cover and the PCB board to form a light-emitting cavity.

Further including:

a reflector, where the reflector is disposed between the transparent cover and the top surface of the PCB board and is located in the light-emitting cavity, and a reflecting surface of the reflector inclines outward gradually from the top surface of the PCB board to a direction the transparent cover lying in.

Further, the lamp body is a plastic member or a glass member.

Further, when the lamp body is the plastic member, the lamp body is detachably connected to the PCB board;

when the lamp body is a glass member, the lamp body is integrally formed with the glass substrate layer of the PCB board.

Further, the transparent cover is a glass cover, or the transparent cover is a transparent plastic cover.

The electrical device provided by the embodiment of the second aspect of the present disclosure includes PCB board described above, since the glass substrate layer of the PCB board is used as the substrate and the insulating dielectric layer replacing the structure bonding a the aluminum substrate or the glass fiber board with the insulating resin in the prior art, and the expansion and extending coefficient of the glass is small, the deformation warp is not easily generated, and the conductive wiring layer is not easily peeled off from the insulating medium layer. Thereby, the use performance of the PCB board is improved. Since the glass may also have the function of dissipating heat, no additional heat radiation structure is required. Thereby, the heat dissipation structure may effectively save costs.

The embodiment of third aspect of the present disclosure provides a manufacturing method of a PCB board, the PCB board includes the PCB board described above, and the manufacturing method of the PCB board includes:

cutting, to obtain a glass substrate layer of a preset size;

arranging a conductive wiring layer on a top surface of the glass substrate layer;

coating a top ink layer on the conductive wiring layer, and preserving a preset position for pre-installing an electronic component; and curing processing the top ink layer.

Further, prior to the coating the top ink layer on the conductive wiring layer, and preserving the preset position for pre-installing the electronic component, further including:

coating a bottom ink layer on a bottom surface of the glass substrate layer.

Further, the arranging the conductive wiring layer on the top surface of the glass substrate layer including:

printing a silver paste wiring by adopting a screen printed on the top surface of the glass substrate layer to form a conductive wiring layer.

Further, after the coating the bottom ink layer on the bottom surface of the glass substrate layer, further including:

heating the glass substrate layer such that the glass substrate layer is uniformly heated to a preset temperature; and cooling the heated glass substrate layer by adopting a preset cooling manner, to temper and fuse the bottom ink layer and the glass substrate layer with the silver paste wiring.

Further, prior to the coating the bottom ink layer on the bottom surface of the glass substrate layer, further including:

sintering the silver paste wiring.

Further, after the curing processing the top ink layer, further including:

printing a character layer on the top ink layer; and curing processing the character layer.

According to the manufacturing method of the PCB board provided by the embodiment of the third aspect of the present disclosure, since the glass substrate layer of the PCB board is used as the substrate and the insulating dielectric layer replacing the structure bonding a the aluminum substrate or the glass fiber board with the insulating resin in the prior art, and the expansion and extending coefficient of the glass is small, the deformation warp is not easily generated, and the conductive wiring layer is not easily peeled off from the insulating medium layer. Thereby, the use performance of the PCB board is improved. Since the glass may also have the function of dissipating heat, no additional heat radiation structure is required. Thereby, the heat dissipation structure may effectively save costs.

BRIEF DESCRIPTION OF THE DRAWINGS

In order to describe the technical solutions in the embodiments of the present disclosure or the prior art more clearly, the drawings required to be used for descriptions about the embodiments or the prior art will be simply introduced below. It is apparent that the drawings described below are some embodiments of the present disclosure. Those of ordinary skill in the art may further obtain other drawings according to these drawings without creative work.

DETAILED DESCRIPTION OF EXAMPLE EMBODIMENTS

Figure 1:
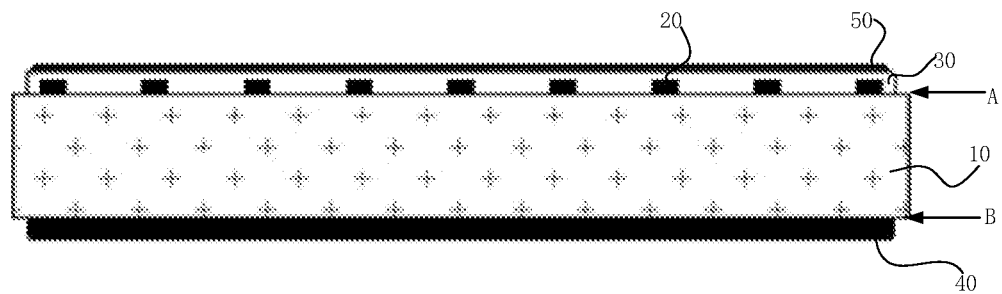
FIG. 1 is a side cross-sectional view of a PCB board according to Embodiment 1 of the present disclosure.

For making the purposes, technical solutions and advantages of the embodiments of the present disclosure clearer, the technical solutions in the embodiments of the present disclosure will be clearly and completely described below in combination with the drawings in the embodiments of the present disclosure. It is apparent that the described embodiments are not all embodiments but part of embodiments of the present disclosure. All other embodiments obtained by those of ordinary skill in the art on the basis of the embodiments in the present disclosure without creative work shall fall within the scope of protection of the present disclosure.

The word "comprising" as used throughout the description and claims is an open term and should be interpreted as "comprising but not limited to". "Substantially" means that within an acceptable error range, those skilled in the art will be able to solve the technical problems within a certain error range, basically achieving the technical effects.

In addition, the term "coupled" is used herein to include any direct and indirect electrical coupling means. Therefore, if it is described here that a first apparatus is coupled to a second apparatus, it is indicated that the first apparatus may be directly and electrically coupled to the second apparatus or indirectly and electrically coupled to the second apparatus through other apparatuses or coupling means. The description is described as an implementation mode for implementing the present disclosure. However, the description is intended to be illustrative of the general principle of the present disclosure, and is not intended to limit the scope of the present disclosure. The scope of protection of the present disclosure is subject to the definition of the appended claims.

It is to be understood that term "and/or" used in the present disclosure is only an association relationship describing associated objects and represents existence of three relationships. For example, A and/or B may represent three conditions, i.e., independent existence of A, coexistence of A and B and independent existence of B. In addition, character "/" in the present disclosure usually represents that previous and next associated objects form an "or" relationship.

Those skilled in the art may combine and grouping the different embodiments or examples described in the specification and the features of the different embodiments or examples without departing from the scope of the invention.

The mechanism of warpage of the PCB board caused in the prior art is as follows: the insulating dielectric layer of the conventional PCB board is made of an inorganic material, and the water content of the glass fiber cloth contained therein is an important factor causing warpage of the PCB board. Since the glass fiber cloth is water-absorbent, when the PCB board is wet, during the PCB board soldering process, the PCB board is deformed and warped due to high and low temperature during soldering.

Embodiment 1

In order to at least solve the above-mentioned series of problems causing the warpage of the PCB board, the embodiment of the disclosure provides a PCB board.

Specifically, FIG. 1 is a side cross-sectional view of a PCB board according to Embodiment 1 of the present disclosure. The PCB board may be applied to various electronic devices, such as a lamp (such as a LED light), a mobile phone, a tablet computer, a notebook computer, a game console, and the like, or, be applied to some electrical devices on the car.

As shown in FIG. 1, the PCB board in the present embodiment includes: an insulating dielectric layer 10, a conductive wiring layer 20, and a top ink layer 30.

The insulating dielectric layer 10 is a glass substrate layer, and the glass substrate layer includes a top surface A and a bottom surface B which are disposed oppositely. The insulating dielectric layer 10 may select or process a preset size as the glass substrate layer. The glass substrate layer itself is a transparent material, and the light may be refracted through the transparent glass substrate layer.

The conductive wiring layer 20 is disposed on the top surface A of the insulating dielectric layer 10. The top ink layer 30 is coated on the conductive wiring layer 20. When the top ink layer 30 is coated, a preset position for pre-installing each electronic component (such as a light source, a resistor, a power source, etc.) may be preserved to connect each electronic component with the conductive wiring layer 20 by the preserved corresponding preset position. When the top ink layer is used as the solder resist ink layer, the color thereof is not limited. For example, a common green or black ink may be used as the top solder resist ink. In the present embodiment, a white reflective ink is used as the top ink layer 30, which may be used as a solder resist on the one hand. On the other hand, when the PCB board is applied to a lamp, such as an LED lamp, the top ink layer 30 selects the white reflective ink layer, which may make the light incident from the light source be reflected by the white reflective ink layer. The light of the lamp may be reflected in the maximum extent, thereby greatly reducing the loss of light. Thereby preventing the light from being refracted through the transparent glass substrate layer, and the light efficiency of the lamp is improved.

According to the PCB board provided the present embodiment, since the glass substrate layer is used as the substrate and the insulating dielectric layer replacing the structure bonding a the aluminum substrate or the glass fiber board with the insulating resin in the prior art, and the thermal conductivity of the glass fiber board is low, the lamp with high power and high power density is inapplicable therein; although the aluminum substrate possesses good thermal conductivity, may need to be in conjunction with insulating resins. Since the expansion and extending coefficient of the glass of the PCB board of the present embodiment is small, the deformation warp is not easily generated, and the conductive wiring layer is not easily peeled off from the insulating medium layer. Thereby, the use performance of the PCB board is improved. Since the glass may also have the function of dissipating heat, no additional heat radiation structure is required. Thereby, the heat dissipation structure may effectively save costs.

In addition, comparing to the manner that combine the aluminum substrate and the insulating resin in the prior art, the PCB board designed in the present embodiment replacing the aluminum substrate by the glass being used as the substrate, and making use of the characteristic of the glass processing both insulated and thermally conductive, may achieve the same effect achieved by the structure of combining the aluminum substrate and the insulating resin, without providing additional an insulating resin, and the cost is effectively saved.

The insulating resin is used as the insulating layer between the copper foil (the conductive wiring layer) in the PCB board and the aluminum substrate in the prior art. However, under high voltage and high temperature, the insulating resin is easily insulating failure, and only basic insulating can be met, which makes the PCB board easily insulating fails under high voltage and high temperature working condition, and fails to guarantee the stable performance of PCB board. In the PCB board of the present embodiment, since the insulating resin is not required, and the glass may achieve the insulating and heat dissipating effects without using the insulating resin, the problem of insulating failure will not happen. Furthermore, the amount of heat deformation of the glass substrate after tempering is much smaller than the amount of heat deformation of the aluminum substrate, which may effectively ensure the performance stability of the PCB board.

Furthermore, the crosstalk between different wires in the wiring is also less than the aluminum substrate in the prior art by using glass as the base material of the substrate, and its EMC (Electro Magnetic Compatibility) is better. The glass substrate has better insulating strength than the aluminum substrate. In the present embodiment, the glass substrate is used as the substrate of the PCB board, which solves the long-term unavoidable problem of the withstand voltage of the aluminum substrate. The existing aluminum substrate product only ensures the withstand voltage within 3 KV without arcing when the heat dissipation creepage distance of 3 mm are ensured, and the glass substrate may achieve more than 5 KV.

Based on the above embodiments, further, the PCB board of the present disclosure may further include: a bottom ink layer 40, and the bottom ink layer 40 is coated on the bottom surface B of the insulating dielectric layer 10. The bottom ink layer 40 is preferably a non-transparent ink layer. Specifically, the bottom ink layer 40 may be a black ink layer. When the PCB board in the present embodiment is mounted on the lamp, the bottom surface B may face the outside of the lamp. Since the substrate is a transparent glass substrate, the bottom surface B may be coated with for example a black non-transparent ink layer, which may effectively shield the electronic component and the conductive wire from appearance, thereby improving the aesthetic measure of the appearance.

The conductive wiring layer 20 may also be laid using copper foil. More preferably, the conductive wiring layer 20 may be a silver paste wiring layer printed by silver paste. Specifically, the silver paste may be printed by a steel mesh. The silver paste is viscous slurry of a mechanical mixture consisted of high purity (99.9%) metallic silver particles, binders, solvents and auxiliaries. The size of silver particles on the insulating dielectric layer 10 is related to the conductivity of silver paste. Under the same volume, the particles are large, the contact probability between the particles is low, and a large space is left, which is occupied by the non-conductor resin, thereby forming a barrier to the conductor particles and lowering the conductivity. On the contrary, the contact probability of fine particles is improved, and the conductivity is better. The size of the particles has an effect on the conductivity. The size of the silver particles of the silver paste is controlled so that the conductive particles (silver particles) of the silver paste can smoothly pass through the mesh of the steel mesh and are densely deposited on the insulating dielectric layer 10 (the glass substrate layer), thereby forming a full conductive pattern and forming the silver paste wiring layer. In the PCB board of the present embodiment, the conductive wiring is directly applied on the glass substrate without disposing other insulating layer, thereby further reducing the manufacturing cost of the PCB board.

It is worth noting that the design of the trace of the conventional PCB board may also be a factor causing the warpage of the PCB board. When the trace of the PCB board is designed, due to some factors of the layout of electronic components and the function of electronic products, the trace of the PCB board may be uneven on the top layer and the bottom layer, for example, one side is a vertical wiring trace, and the other side is a horizontal wiring trace, or one side processing a large area of copper, and the other side processing no or a small amount of copper. The stretchability of the copper foil is different from that of the glass fiber cloth. When the copper foil on the surface of the PCB board is evenly distributed, the copper foil stretches the surface of the PCB board to cause distortion of the circuit board. In the present embodiment, the deformation of the PCB board can be more effectively prevented by the cooperation of the silver paste wiring and the glass substrate layer.

Further, a character layer 50 may also be printed on the top ink layer 30, and the character layer 50 is cured. It can be understood that the character layer 50 is a printed character dispersedly arranged on the top ink layer 30. The printed character may be located next to the electronic component soldered on the PCB board, to indicate the name of the corresponding electronic component.

In addition, when the PCB board in the present embodiment is applied to other fields, such as an electrical device on a car, the top ink layer 30 and the bottom ink layer 40 may be black ink layers, and the black ink layer may also be solder resist. The absorption coefficient of the black ink layer is higher than that of the white ink. Or when the PCB board in the present embodiment is applied to other fields, the top ink layer 30 and the bottom ink layer 40 may be other color ink layers being selected according to actual conditions.

Embodiment 2

Figure 2:
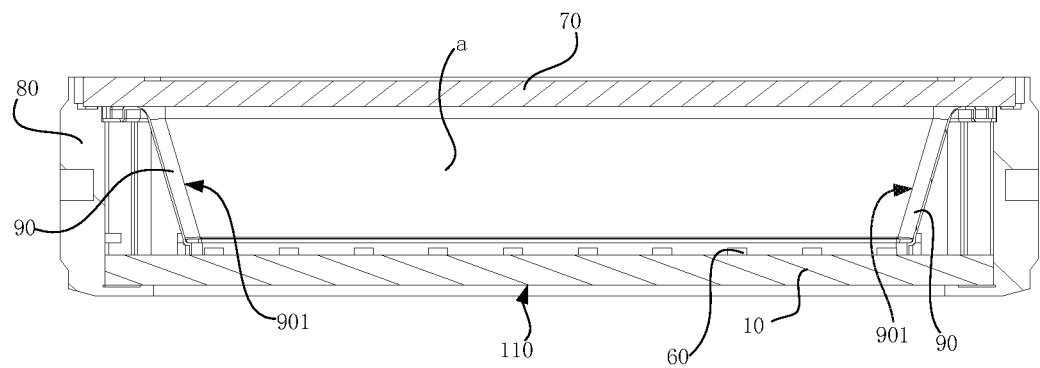
FIG. 2 is a schematic structural diagram of a lamp according to Embodiment 2 of the present disclosure.

The present embodiment provides an electrical device, including the PCB board in Embodiment 1. Specifically, the electrical device can be a lamp. FIG. 2 is a schematic structural diagram of a lamp according to Embodiment 2 of the present disclosure. The view angle is a side cross-sectional view. As shown in FIG. 2, the lamp of the embodiment further includes a light source 60. The light source 60 is disposed on the top surface A of the PCB board 110. The light source 60 is electrically connected to the conductive wiring layer. The light source 60 and the electronic component are attached to the glass substrate of the PCB board to form a direct heat dissipation, without the assistance of the heat-dissipating material such as the thermal grease. Comparing to the combination of the aluminum substrate+the heat sink in the prior art, the assembly uncertainty is reduced and is more environmental friendly.

Further, the transparent cover 70 and the lamp body 80 are further disposed. The transparent cover 70 is disposed opposite to the top surface A of the PCB board. The lamp body 80 is disposed between the transparent cover 70 and the PCB board 110 for connecting the transparent cover 70 and PCB board 110. The transparent cover 70 has a spacing from the top surface A of the PCB board 110 to form a light-emitting cavity a. Preferably, the transparent cover 70 is a glass cover, or the transparent cover 70 is a transparent plastic cover.

As shown in FIG. 2, the lamp body 80 can be a plastic member. When the lamp body 80 is a plastic member, the lamp body 80 can be detachably connected to the PCB board. For example, the lamp body 80 can be engaged with the PCB board 110. The edge of the PCB board 110 is connected to the lamp body 80. The intermediate position of the PCB board 110 is directly in contact with the air to dissipate heat. Since the PCB board 110 is made of glass as the substrate layer, the glass has good insulating and thermal conductivity, and is directly in contact with air to dissipate heat. There is no need to provide a heat sink to help to dissipate heat, and the cost is saved thereby.

Figure 3:
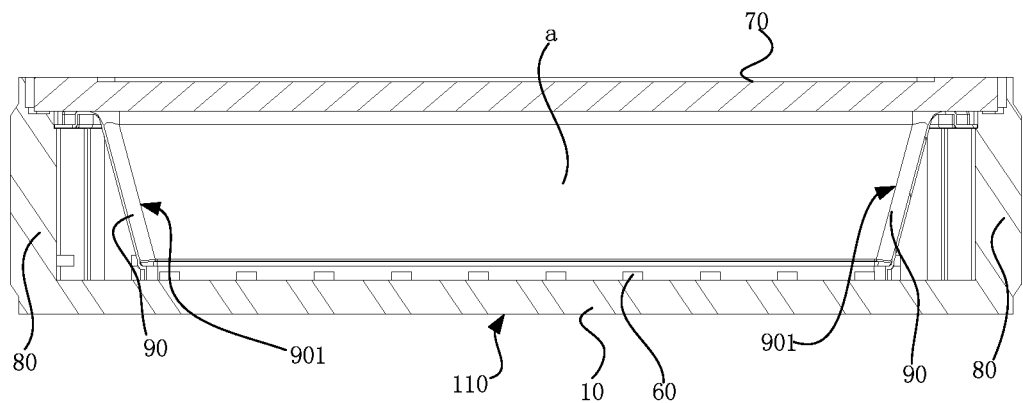
FIG. 3 is another schematic structural diagram of a lamp according to Embodiment 2 of the present disclosure.

As an alternative, as shown in FIG. 3, the lamp body 80 can also be a glass member, and the lamp body 80 can be integrally formed with the glass substrate layer of the PCB board 110, that is, the glass substrate layer of PCB board 110 doubles the light body. In the prior art, the assembly process between the PCB board and the lamp body of the lamp is complicated, and the lock screw and the coating the insulating thermal grease are required; the so called lamp body of the lamp is a heat sink connected to the PCB board, and the connecting between the PCB board combining the aluminum substrate and the insulating resin requires a connecting member such as a screw in the prior art, and the coating the thermal grease is required. The lamp in the present embodiment adopts the PCB board in the embodiment, and the substrate of the PCB board in Embodiment 1 is a glass substrate. Since the glass itself has good thermal conductivity and insulating, the lamp shown in FIG. 3 directly utilizes the glass substrate of the PCB board as a part of the lamp body of the lamp, so that the operations of locking screw and the coating the thermal grease are not required, which simplifies the manufacturing process and cost of the lamp to a certain extent. The heat dissipation performance of the PCB board of glass base material is excellent, and the glass can be directly used as the lamp body and of the lamp as well as the heat sink, eliminating the base aluminum plate or the glass fiber board, which greatly reduces the material cost and the process cost of the lamp. Moreover, the PCB board using the glass substrate is used as the PCB board of the lamp, so that the light effect can be further improved.

Optionally, the present embodiment further provides another lamp. Based on the above embodiment, a rear insulating case (not shown) may be further included. The rear insulating case is fastened to the bottom surface B of the PCB board 110, and there is a space between the insulating shell and the bottom surface B of the PCB board to form a heat dissipation cavity.

In addition, the lamp in the present embodiment may further include a reflector 90 disposed between the transparent cover and the top surface A of the PCB 110 and located in the light-emitting cavity a. A reflecting surface 901 of the reflector 90 inclines outward gradually from the top surface A of the PCB board 110 to a direction the transparent cover 80 lying in. The reflector 90 is disposed in such a manner that the light emitted by the light source can be effectively dispersed according to a predetermined path, thereby greatly improving the light utilization efficiency of the lamp and greatly improving the efficiency of the lamp.

The lamp in the embodiment of the disclosure includes the PCB board in Embodiment 1, and has the structure and function of the PCB board described in Embodiment 1. For details, refer to the description of Embodiment 1, and the details are not described herein.

Figure 4:
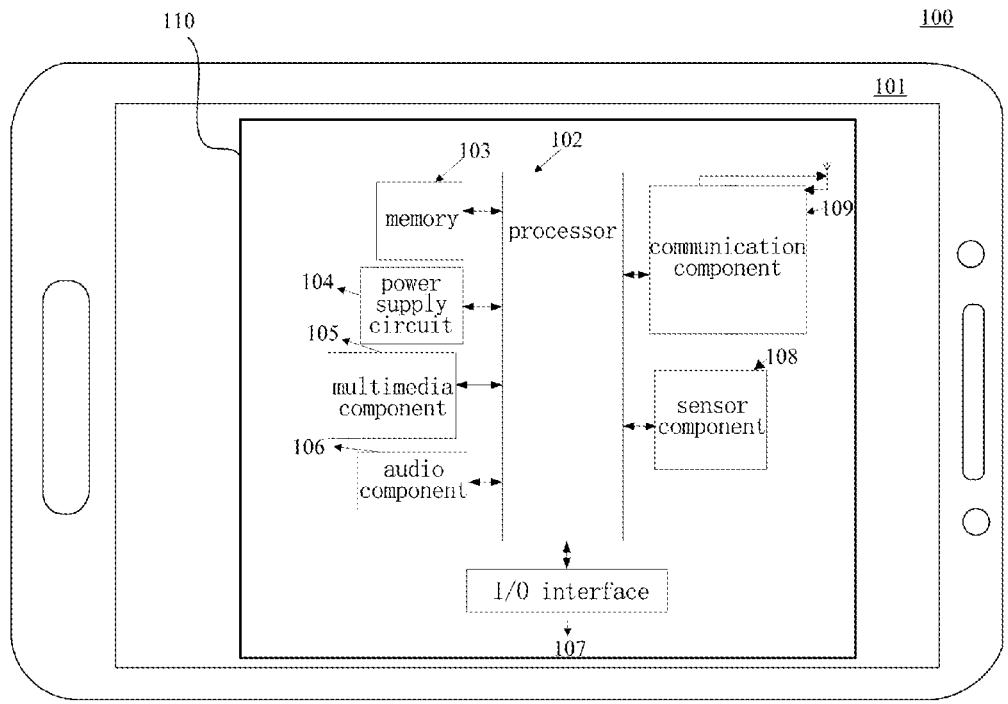
FIG. 4 is a schematic structural diagram of a terminal device according to Embodiment 2 of the present disclosure.

Specifically, the electrical device in the embodiment of the present disclosure may be a terminal device. FIG. 4 is a schematic structural diagram of a terminal device according to Embodiment 3 of the present disclosure. Specifically, referring to FIG. 4, the terminal device 100 in the present embodiment may be a computer or a mobile phone.

The terminal device 100 may include a housing 101, and one or more of the following components: a processor 102, a memory 103, a power supply circuit 104, a multimedia component 105, an audio component 106, an input/output (I/O) interface 107, and a sensor component 108, and a communication component 109. The power supply circuit 104 is used to supply power to various circuits or devices of the terminal device 100; the memory 103 is used to store executable program code; and the processor 102 runs and executable the program corresponding to the program code by reading executable program code stored in the memory 103; and the terminal device 100 further includes a PCB board 110 provided by any of the above embodiments, the PCB board 110 is disposed inside the space enclosed by the housing 101, and the processor 102 and the memory 103 are disposed on the PCB board 110.

The terminal device provided by the embodiment of the present disclosure includes the PCB board in Embodiment 1, and has the structure and function of the PCB board described in Embodiment 1. For details, refer to the description of the first embodiment, and the details are not described herein.

Of course, the electrical device in the present embodiment may also be other devices, which will not be illustrated one by one in the present embodiment. All embodiments including the electrical device of the PCB board in Embodiment 1 are in the scope of protection of the present disclosure.

Embodiment 3

A circuit board manufacturing process may also cause board warpage to exceed the standard. In the process of manufacturing the circuit board, the electroplating process is carried out in the solution, and the soldering and white solidification are baked at a high temperature. The conversion from one process to another requires water washing and drying. These frequent high and low temperatures may cause board warpage if the board is not placed flat during the manufacturing process of the board.

Moreover, from the environmental point of view, the circuit board production process in the prior art involves etching, solder resist ink, tin-spraying process, etc. The above processes all contain a large number of chemical raw materials and heavy metals. For example, etching must undergo strong acid, such as sulfuric acid, hydrochloric acid and the like for etching. The solder resist ink is also a chemical component of a specific formulation. Some processes also require the use of ammonia water, etc. In short, the manufacturing process of the conventional PCB board is a highly polluting manufacturing process, which is not environmentally friendly.

Figure 5:
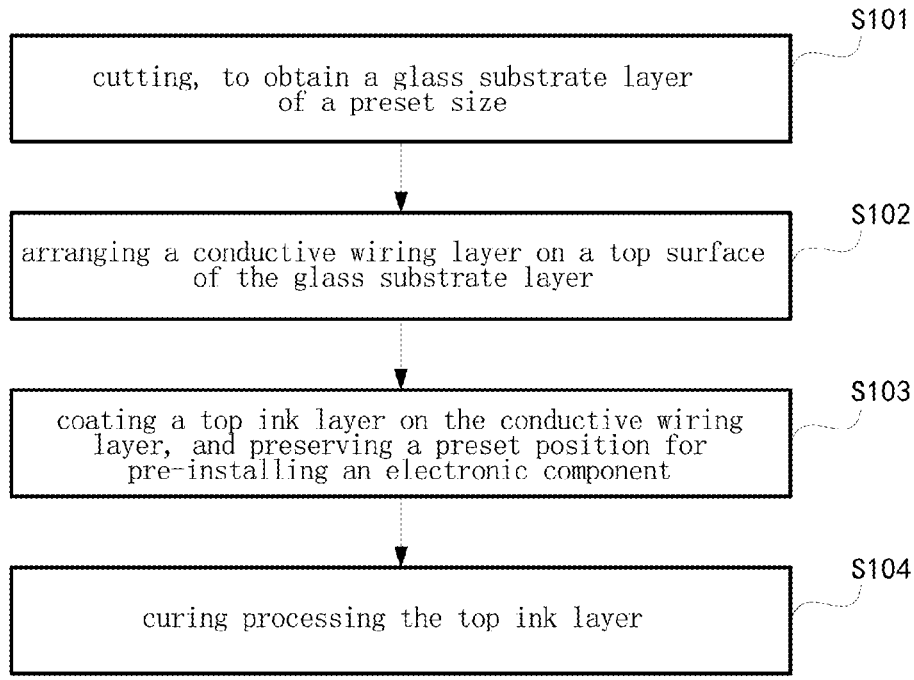
FIG. 5 is a flowchart of a manufacturing method of a PCB board according to Embodiment 3 of the present disclosure.

In order to solve the above problems in the conventional PCB board manufacturing process, the present disclosure also provides a manufacturing method of a PCB board. Specifically, FIG. 5 is a flowchart of a manufacturing method of a PCB board according to Embodiment 3 of the present disclosure. As shown in FIG. 5, the manufacturing method of the PCB board provided by the present embodiment, the PCB board is a PCB board of Embodiment 1, and the manufacturing method includes the following steps:

S101: cutting, to obtain a glass substrate layer of a preset size.

S102: arranging a conductive wiring layer on a top surface of the glass substrate layer.

In the present embodiment, preferably, the arranging the conductive wiring layer on the top surface of the glass substrate layer includes: printing a silver paste wiring by adopting a screen printed on the top surface of the glass substrate layer to form a conductive wiring layer, and sintering the silver paste wiring. The sintering process may increase the strength of the silver paste wiring layer and prevent the silver paste from flowing during the subsequent process. The drying temperature may usually be controlled from 120° C. to 300° C. The sintering temperature is controlled at 400° C. to 600° C. The manner of arranging the silver paste wiring is simpler than the manner of laying the copper foil in the prior art. Of course, as an alternative, the silver paste wiring may also be printed onto the glass substrate layer by gravure printing.

The process of printing the silver paste wiring layer in the present embodiment is as follows: stretching→photoresist sizing→drying→printing→developing→drying.

The Stretching is the process of firmly bonding a tight mesh to a frame. In the present embodiment, preferably, the selected mesh may have a mesh number of 150-300 mesh, and the applied photoresist may have a thickness of 10-20 µm.

The photoresist sizing refers to uniformly coating the photoresist on the screen to block all the meshes of the screen to form a photosensitive film.

The purpose of the drying is to preliminarily dry the photoresist on the screen.

The printing refers to drying the surface of the screen after applying a layer of photosensitive film, covering the film with the image (wiring pattern), illuminating the film with strong light, and exposing the image on the film to the photosensitive film on the plate.

The developing refers to curing the position of the mesh where the wiring pattern has not passed. However, the position of the mesh where the wiring pattern has passed is blocked and does not transmit light thereby, so that it cannot be cured and a leak hole is formed to enable the subsequent silver paste pass, and further the silver paste is printed on the glass substrate through the mesh corresponding to the wiring pattern.

The drying is the drying of a wire mesh formed with a wiring pattern.

Then, the silver paste is coated on the screen, and the mesh corresponding to the wiring pattern exposes the silver paste to the glass substrate, and a silver paste wiring layer is formed on the glass substrate.

S103: coating a top ink layer on the conductive wiring layer, and preserving a preset position for pre-installing an electronic component.

It can be understood that the coated top ink layer may be selected according to actual needs. Specifically, for example, when the application field is in the field of a lamp, the coated top ink layer may be a white reflective ink layer to improve the light effect of the lamp.

S104: curing processing the top ink layer.

Specifically, the top ink layer may be pre-cured by thermal curing at a temperature of 120° C. to 300° C., more preferably at 150±5° C., and then cured by ultraviolet (UV). The ultraviolet (UV) curing refers to a process taking the ultraviolet light as 100% an energy-induced reactivity liquid material to rapidly convert into a solid. By combining the two curing manner, the curing effect may be further improved, and the top ink layer after curing is not easily peeled off.

Further, the character layer may also be printed on the top ink layer after the top ink layer is cured. Similarly, the character layer needs to be dried and cured after printing the character layer. The curing method used may be the same as that of the top ink layer, and will not be described here.

Embodiment 4

Figure 6:
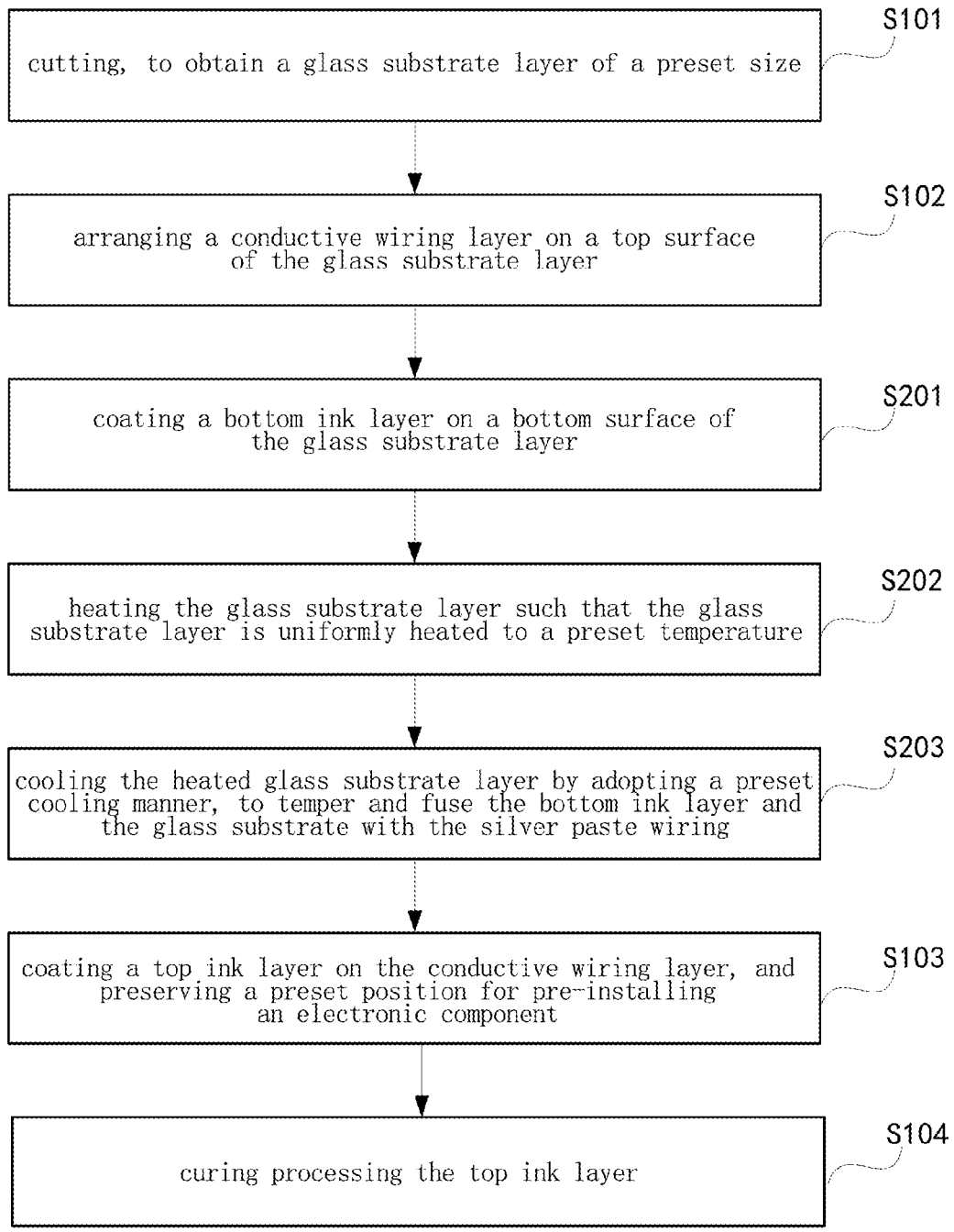
FIG. 6 is a flowchart of a manufacturing method of a PCB board according to Embodiment 4 of the present disclosure.

FIG. 6 is a flowchart of a manufacturing method of a PCB board according to Embodiment 4 of the present disclosure. As shown in FIG. 6, on the basis of Embodiment 3, further, prior to S103, may include:

S201: coating a bottom ink layer on a bottom surface of the glass substrate layer.

The bottom ink layer is arranged on the bottom surface of the glass substrate to shield the electronic component and the conductive wiring layer of the PCB board, thereby improving the appearance of the electrical device. Preliminary drying may be carried out after coating the bottom ink layer, specifically at 120° C. to 300° C., more preferably at 150±5° C.

After S201, the method may further include:

S202: heating the glass substrate layer such that the glass substrate layer is uniformly heated to a preset temperature.

S203: cooling the heated glass substrate layer by adopting a preset cooling manner, to temper and fuse the bottom ink layer and the glass substrate with the silver paste wiring.

In the present embodiment, when a common glass substrate layer is heated in a heating furnace close to a softening temperature (600 to 700° C.) of the glass, the glass removes internal stress by its own deformation. Then the glass is removed from the heating furnace, and the high-pressure cold air is blown to both sides of the glass by a multi-head nozzle to cool the glass is rapidly and uniformly to room temperature, thereby the tempered glass is obtained. Since the bottom ink layer and the silver paste wiring are printed on the glass substrate layer, the bottom ink layer, the silver paste wiring and the glass substrate layer are tempered and fused together during the tempering process of the glass substrate layer. The silver paste wiring and the bottom ink layer are not easily peeled off after the fusion, thereby effectively improving the service life of the PCB board.

It should be noted that since the top surface A of the PCB board is used for mounting the electronic component, the top ink layer is not frequently contacted after being installed in the electrical device, and the bottom ink layer is more easily touched by humans. The ability to resist peeling of the top ink layer is required even lower. The bottom ink layer may not be tempered together with the glass substrate, and only ordinary curing treatment is required.

In addition, it is worth noting that in embodiments in which the bottom ink layer is not coated, only the silver paste wiring layer may be tempered together with the glass substrate.

Of course, it can be understood that, in the present embodiment, the cooling manner of the glass substrate layer may be performed by using a rapid air cooling manner, and other cooling manners, such as water cooling, oil cooling, etc., may also be used. Those skilled in the art may select a proper cooling manner according to actual needs.

The manufacturing method of the PCB board in Embodiment 3 or Embodiment 4 does not evolve the chemical solution treatment process in the whole process, only the ink and the silver paste are chemical, but the processing of the ink and the silver paste is only coating and curing treatments, which do not produce waste water and waste gas, and is very environmentally friendly.

It should be noted that the implementation steps of the manufacturing method of the PCB board in the present embodiment are not limited to the above-defined order, and the order of implementation between the steps may be changed within a reasonable range, or may be implemented simultaneously.

The structure and function of the PCB board manufactured by the manufacturing method of the PCB board provided by Embodiment 3 and Embodiment 4 of the present disclosure are the same as those described in Embodiment 1 and Embodiment 2. For details, refer to the description of Embodiment 1 and Embodiment 2, which is not repeated here.

It is finally to be noted that the above embodiments are adopted not to limit but only to describe the technical solutions of the present disclosure. Although the present disclosure has been described with reference to the above-mentioned embodiments in detail, those of ordinary skill in the art should know that modifications may still be made to the technical solutions recorded in each embodiment or equivalent replacements may be made to part of technical features therein. These modifications or replacements do not make the essences of the corresponding technical solutions depart from the spirit and scope of the technical solutions of each embodiment of the present disclosure.

The invention claimed is:

1. A manufacturing method of a PCB board, comprising:
   cutting, to obtain a glass substrate layer of a preset size;
   arranging a conductive wiring layer on a top surface of the glass substrate layer;
   coating a top ink layer on the conductive wiring layer, and preserving a preset position for pre-installing an electronic component; and
   curing processing the top ink layer;
   wherein prior to coating the top ink layer on the conductive wiring layer, and preserving the preset position for pre-installing the electronic component, further comprising:
   coating a bottom ink layer on a bottom surface of the glass substrate layer;
   wherein after the coating the bottom ink layer on the bottom surface of the glass substrate layer, further comprising:
   heating the glass substrate layer uniformly to a preset temperature; and
   cooling the heated glass substrate layer by adopting a preset cooling manner, to temper and fuse the bottom ink layer, the conductive wiring layer and the glass substrate layer together.

2. The manufacturing method of the PCB board according to claim 1, prior to the coating the top ink layer on the conductive wiring layer, and preserving the preset position for pre-installing the electronic component, further comprising:
   coating a bottom ink layer on a bottom surface of the glass substrate layer.

3. The manufacturing method of the PCB board according to claim 2, the arranging the conductive wiring layer on the top surface of the glass substrate layer comprising:
   printing a silver paste wiring by adopting a screen printed on the top surface of the glass substrate layer to form a conductive wiring layer.

4. The manufacturing method of the PCB board according to claim 1, prior to the coating the bottom ink layer on the bottom surface of the glass substrate layer, further comprising:
   sintering a silver paste wiring.

5. The manufacturing method of the PCB board according to claim 1, after the curing processing the top ink layer, further comprising:
   printing a character layer on the top ink layer; and
   curing processing the character layer.

6. A PCB board prepared by the manufacturing method according to claim 1, comprising:
   an insulating dielectric layer, wherein the insulating dielectric layer is a glass substrate layer, and the glass substrate layer comprises a top surface and a bottom surface disposed oppositely;
   a conductive wiring layer, wherein the conductive wiring layer is disposed on the top surface of the insulating dielectric layer and is in connection with the insulating dielectric layer directly;
   a top ink layer, wherein the top ink layer is coated on the conductive wiring layer; and a bottom ink layer, wherein the bottom ink layer is coated on the bottom surface of the insulating dielectric layer.

* * * * *